(12) United States Patent
Albrecht et al.

(10) Patent No.: US 7,192,658 B2
(45) Date of Patent: Mar. 20, 2007

(54) ORGANIC LIGHT-EMITTING DIODE FOR DISPLAY AND METHOD FOR FABRICATING THE SAME

(75) Inventors: Uhlig Albrecht, Berlin (DE); Fischer Joerg, Berlin (DE); Zabel Andreas, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/625,780

(22) Filed: Jul. 24, 2003

(65) Prior Publication Data

US 2004/0115474 A1 Jun. 17, 2004

(30) Foreign Application Priority Data

Nov. 6, 2002 (EP) ............................ 02090368
Feb. 25, 2003 (KR) ................... 10-2003-0011591

(51) Int. Cl.
*H05B 33/12* (2006.01)
*H01L 51/50* (2006.01)
(52) U.S. Cl. ............... 428/690; 428/917; 313/504; 313/506; 427/66
(58) Field of Classification Search ........... 428/690, 428/917; 313/504, 506; 427/66
See application file for complete search history.

(56) References Cited

U.S. PATENT DOCUMENTS

| | | | |
|---|---|---|---|
| 5,652,067 A | | 7/1997 | Ito et al. |
| 5,837,391 A | * | 11/1998 | Utsugi ........................ 428/690 |
| 6,348,359 B1 | | 2/2002 | Van Slyke et al. |
| 2003/0170491 A1 | * | 9/2003 | Liao et al. .................. 428/690 |

FOREIGN PATENT DOCUMENTS

JP 09082476 3/1997
WO WO-01/39287 A1 5/2001

OTHER PUBLICATIONS

JPO website English translation of JP 09-082476 A.*
Brown, T. M. et al.: "Efficient Electron Injection in Blue-Emitting Polymer Light-Emitting Diodes with Lif/Ca/Al Cathodes", Applied Physics Letters, vol. 79, No. 2, p. 174-176, Jul. 9, 2001.
Heil, H., et al.: "Mechanisms of Injection Enhancement in Organic Light-Emitting Diodes Through and Al/Lif Electrode"Journal of Applied Physics, vol. 89, No. 1, p. 420-424, Jan. 1, 2001.
Yang, X., et al.: "Efficient Polymer Light Emitting Diodes with Metal Fluoride/AL Cathodes" Applied Physics Letters, vol. 79, No. 5, p. 563-565, Jul. 30, 2001.
Cao, Y., et al.: "Ultrathin Layer Alkaline Earth Metals as Stable Electron-Injecting Electrodes for Polymer Light Emitting Diodes" Journal of Applied Physics, vol. 88, No. 6, p. 3618-3623, Sep. 15, 2000.

* cited by examiner

*Primary Examiner*—Dawn L. Garrett
(74) *Attorney, Agent, or Firm*—H.C. Park & Associates, PLC

(57) ABSTRACT

An organic light-emitting diode for a display and a method for fabricating the organic light-emitting diode which has lower contact resistance between the cathode and the cathode contact layer and which may be operated with a reduced amount of power. The organic light-emitting diode has an anode layer, an emissive layer, a cathode which has an electron injecting layer and an electrical conducting layer, and a cathode contact layer which electrically connects the cathode and an electrical driving system of the display. The electrical conducting layer of the cathode is electrically connected with the cathode contact layer, however, the electron injecting layer is not in direct contact with the cathode contact layer. Both the electron injecting layer and the electrical conducting layer of the cathode may be formed such that they are aligned with the emissive layer. In this case, a connecting layer is formed to connect the electrically conducting layer and the cathode contact layer.

27 Claims, 1 Drawing Sheet

ORGANIC LIGHT-EMITTING DIODE FOR DISPLAY AND METHOD FOR FABRICATING THE SAME

This application claims priority from German Patent Application 02 090 368.8, filed on Nov. 6, 2002 in the German Patent Office and Korean Patent Application 2003-11591, filed on Feb. 25, 2003 in the Korean Intellectual Property Office, the disclosures of which are incorporated herein in their entirety by reference.

BACKGROUND OF THE INVENTION

1. Field of the Invention

This invention relates to an organic light-emitting diode, for a display, with low cathode contact resistance, and a method for fabricating the same.

2. Description of the Related Art

Displays using an organic light-emitting diode (OLED) provide great brightness and a wide viewing angle. OLEDs are self-luminous so they do not require back light and can be effectively used even under relatively dark ambient conditions.

OLEDs include an organic semiconductor layer which acts as an emissive layer between two electrodes. At least one of these electrodes is formed of transparent material.

Generally, a transparent anode is formed by coating, for example, indium tin oxide (ITO), which is transparent to visible ranges of light waves, on a glass substrate. A cathode is formed, for example, of a metal, such as aluminum, by vapor deposition.

When a voltage is applied across the electrodes, colored light may be emitted, wherein the color of light emitted varies depending on the material of the organic emissive layer. For light emission, electrons and carriers (holes) are injected from the cathode and the anode, respectively, and the electrons and carriers migrate into the organic emissive layer under an electric field to combine in the organic emissive layer. Exitons, which are electrically neutral, are generated by the combination of the electrons and the holes in the organic emissive layer. As this excited state transits to a base state, light is generated.

EP 1083612 A2 discloses an OLED with a cathode having a multi-layered structure, such as, for example, lithium fluoride, calcium, and aluminum layers or barium and silver layers. Lithium, calcium, and/or barium layers act to inject electrons into an emissive layer. A lithium fluoride layer has a thickness, for example, of a few nanometers, and a barium and/or calcium layer has a thickness, for example, of 100 nm. An aluminum or silver layer transports a large amount of electrons from a cathode contact layer to the emissive layer. The aluminum or silver layer has a thickness, for example, of 0.2–2 µm. Thus, in such a multi-layered cathode, the lithium chloride, calcium, or barium layer forms an electron injecting layer, and the aluminum or silver layer forms an electrical conducting layer of the cathode.

The cathode of an OLED is electrically connected to an electrical driving system of a display via a flexible printed circuit (FPC). FPCs are used in manufacturing LCD displays, as well as, OLED-based displays. An FPC is bound to a display substrate by a hot sealing method using an anisotropic adhesive film under predetermined temperature and pressure conditions. When the FPC is directly bound to the cathode by hot sealing, the cathode may be damaged by the pressure and the temperature applied to seal and bind the FPC to the cathode. Accordingly, the FPC and the cathode (including an electron injecting layer and an electrical conducting layer) should be separated from one another. A cathode contact layer may be used to separate the cathode and the FPC from one another. The cathode contact layer may be formed of, for example, ITO. For electrical contact between the cathode and the cathode contact layer, the cathode is formed to extend over the emissive layer and a portion of the cathode contact layer by thermal evaporation using, for example, a shadow mask. A portion of the cathode contact layer which is not in contact with the cathode is used to connect with the FPC or other parts of a display. With such an arrangement, the cathode and the FPC can be electrically connected without direct contact therebetween. Accordingly, in such an arrangement, charges flow between the cathode and the FPC via the cathode contact layer.

FIG. 1 is a sectional view of a conventional OLED having the structure described above. In FIG. 1, an anode layer 2 is arranged on a substrate 1, and an emissive layer 3, which represents a pixel surface during display operation, is arranged on the anode layer 2. A cathode contact layer 7 is arranged on the substrate 1 and, as shown in FIG. 1, the cathode contact layer 7 is not in direct contact with the anode layer 2. An electron injecting layer 4 which is formed, for example, of lithium chloride, is arranged on the emissive layer 3 and a portion of the cathode contact layer 7. An electrical conducting layer 5 formed for example, of aluminum, is arranged on the electron injecting layer 4. An FPC 6 is arranged on a portion of the cathode contact layer 7 that is not covered with the electron injecting layer 4 and the electrical conducting layer 5. In this way, a cathode comprising the electron injecting layer 4 and the electrical conducting layer 5, can be electrically connected with the FPC 6 without direct physical contact.

In a display including a number of pixels arranged in a matrix, as is well known, a cathode of the display comprises a plurality of cathode lines and each cathode line is commonly connected to the plurality of pixels. However, this cathode structure disadvantageously increases electrical resistance gradually as a current flows along the cathode lines.

To resolve this problem, JP 10294183, for example, discloses the use of an auxiliary cathode formed of a high-current conductive material. The same approach for an anode is found, for example, in JP 2001015268. JP 2001282136 discloses the use of an aluminum auxiliary layer underneath an ITO cathode contact layer to prevent ohmic loss in a cathode contact layer and cathode lines.

However, in a multi-layered cathode including an electron injecting layer and an electrical conducting layer, calcium, barium, and lithium chloride layers, etc., which are used to form the electron injecting layer, are known to increase electrical resistance. In addition, the calcium or barium layer, for example, is partially oxidized through a reaction with oxygen present on the substrate or in an evaporation system, into calcium oxide or barium oxide, which are electrical insulators. As a result, the electrical contact resistance between the cathode and the cathode contact layer increases. A greater electrical resistance caused by the cathode requires a larger amount of power to operate an OLED or a display employing such a cathode, so that undesirable heat development occurs in the OLED or the display.

SUMMARY OF THE INVENTION

The present invention provides an organic light-emitting diode (OLED) for a display that has a reduced contact resistance between a cathode and a cathode contact layer and requires a less amount of power at a given capacity, and a method of fabricating the OLED.

In an aspect of the present invention, there is provided an OLED for a display, comprising an anode layer, an emissive layer; a cathode including an electron injecting layer and an electrical conducting layer, and a cathode contact layer which electrically connects the cathode and an electrical driving system of the display, wherein the electrical conducting layer of the cathode is electrically connected with the cathode contact layer and the electron injecting layer is not in direct contact with the cathode contact layer.

In another aspect of this invention, an OLED for a display comprises an anode layer, an emissive layer, a cathode including an electron injecting layer and an electrical conducting layer, a cathode contact layer which electrically connects the cathode and an electrical driving system of the display, and a connecting layer formed of an electrically conductive material, the connecting layer directly contacting the cathode contact layer and the electrical conducting layer of the cathode.

In various embodiments of the OLEDs described above, the electron injecting layer of the cathode is formed of at least one of lithium fluoride, barium, barium oxide, and calcium oxide. The connecting layer is formed of copper or gold.

In various embodiments of this invention, the emissive layer may be formed of a light-emitting polymer, such as polyphenylenevinylenes (PPVs) and polyfluorenes (PFOs). Alternatively, the emissive layer may be formed of polyethylene-dioxythiophene and a light-emitting polymer, such as paraphenylene vinylene.

In various embodiments of this invention, the emissive layer may include a hole injecting layer formed of, for example, N,N'-di(naphthalene-1-yl)-N,N'-diphenyl-benzidine and a light-emitting electron conducting layer formed of, for example, 8-hydroxyquionoline aluminum.

In various embodiments of this invention, the electrical conducting layer may be formed of aluminum or silver, and the anode layer may be formed of indium tin oxide (ITO). The cathode contact layer may be formed of ITO.

In another aspect of the present invention, there is provided a method of fabricating an OLED for a display, the method comprising forming an anode layer on a first portion of a substrate, forming a cathode contact layer on a second portion of the substrate, forming an emissive layer on the anode layer, forming an electron injecting layer of a cathode on the emissive layer, and forming an electrical conducting layer of the cathode on the electron injecting layer, the electrical conducting layer of the cathode directly contacting at least a portion of the cathode contact layer.

In another aspect of this invention, a method of fabricating an OLED for a display according to the present invention is provided. The method comprises forming an anode layer on a first portion of a substrate, forming a cathode contact layer on a second portion of the substrate, forming an emissive layer on the anode layer, sequentially forming an electron injecting layer and an electrical conducting layer of a cathode on the emissive layer, and forming a connecting layer, the electrical connecting layer directly contacting the cathode contact layer and the electrical conducting layer of the cathode.

In the OLED fabricating methods according to the present invention, a shadow mask may be used to form at least one of the electron injecting layer and the electrical conducting layer such that at least one of the electron injecting layer and the electrical conducting layer is not to contact the cathode contact layer. Similarly, the connecting layer may be formed using a shadow mask.

BRIEF DESCRIPTION OF THE DRAWINGS

The above and other features and advantages of the present invention will become more apparent by describing in detail exemplary embodiments thereof with reference to the attached drawings..

DETAILED DESCRIPTION OF THE INVENTION

An organic light-emitting diode (OLED) and a method for fabricating the same according to the present invention will be described with the following exemplary embodiments and with reference to the accompanying drawings.

A multi-layered cathode has a greater contact resistance with respect to a cathode contact layer formed of indium tin oxide (ITO), than a single layered aluminum cathode, for example. To compare the contact resistance of different arrangements, it is assumed that a single layered cathode formed of a 500-nm-thick aluminum layer has about 100% contact resistance with respect to the ITO cathode contact layer. Using that arrangement and contact resistance as a marker, a multi-layered cathode including a 1-nm-thick lithium chloride layer, a 10-nm-thick calcium layer, and a 500-nm-thick aluminum layer has a relative contact resistance of about 111%, a cathode including a 1-nm-thick lithium chloride layer and a 500-nm-thick aluminum layer has a relative contact resistance of about 695%, and a cathode including a 10-nm-thick calcium layer and a 500-nm-thick aluminum layer has a relative contact resistance of about 157%.

For multi-layered cathodes with such electron injecting layers, calcium or barium, for example, is oxidized through a reaction with oxygen present on a substrate or in an evaporation system forming an electrical insulator. Due to the formation of an electrical insulator, such multi-layered cathodes have greater contact resistances than a single-layered cathodes.

Lithium chloride, calcium, and/or barium, for example, which may be contained in the multi-layered cathode, act to inject electrons into an emissive layer. Thus, although these materials form an electrical insulator, these materials are used in multi-layered cathodes because they inject electrons into the emissive layer. In order to reduce the contact resistance between the cathode and a cathode contact layer as much as possible, a multi-layered cathode structure should not allow the electron injecting layer to be in direct contact with the cathode contact layer.

Figure 1:
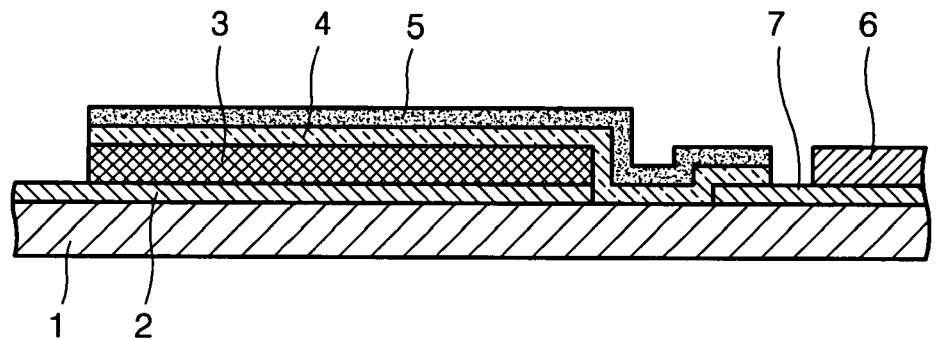
FIG. 1 is a sectional view of a conventional organic light-emitting diode (OLED).
Figure 2:
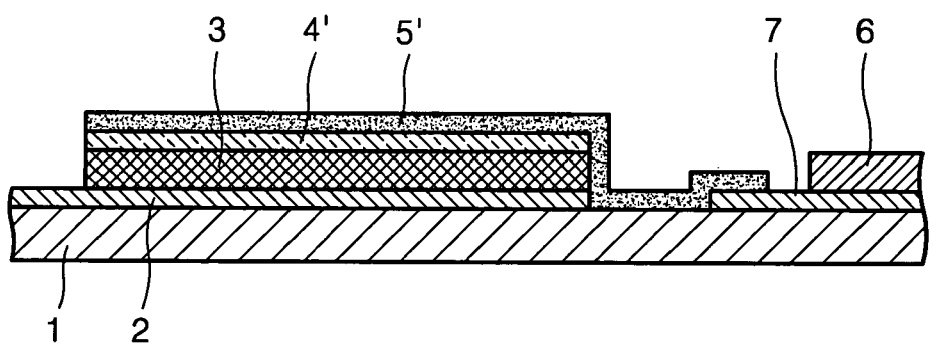
FIG. 2 is a sectional view of an OLED according to one example of the present invention, in which an electrical conducting layer of a cathode directly contacts a cathode contact layer.

FIG. 2 is a sectional view of an OLED according to an embodiment of the present invention, in which an electrical conducting layer of a cathode directly contacts a cathode contact layer. In FIG. 2, elements having a structure and a function which are common to those of FIG. 1 are denoted by the same reference numerals as those of FIG. 1.

Referring to FIG. 2, the anode layer 2 is arranged on the substrate, and the emissive layer 3, which represents a pixel surface during display operation, is arranged on the anode layer 2. The emissive layer 3 may be formed, for example, of a light-emitting polymer, such as polyphenylenevinylenes (PPVs) or polyfluorenes (PFOs). The emissive layer 3 may also be formed, for example, of polyethylene-dioxythiophene and a light-emitting polymer, such as paraphenylene vinylene. Further, the emissive layer 3 may include a hole injecting layer formed, for example, of N,N'-di(naphthalene-1-yl)-N,N'-diphenyl-benzidine and a light-emitting electron conducting layer formed, for example, of 8-hydroxyquionoline aluminum.

As shown in FIG. 2, the cathode contact layer 7 is arranged on the substrate 1 in such a manner that it is not in contact with the anode layer 2. An electron injecting layer 4' is formed of an electrical insulator, such as, for example, lithium fluoride, calcium oxide, or barium oxide. The electron injecting layer 4' of FIG. 2 is formed on the emissive layer 3. In contrast to the electron injecting layer 4 shown in FIG. 1, the electron injecting layer 4' of FIG. 2 does not extend over the substrate 1 and the cathode contact layer 7. Thus, in an embodiment of this invention, the electron injecting layer may only overlap the emissive layer 3.

Further, in this embodiment of the invention, an electrical conducting layer 5' of a cathode is formed on the electron injecting layer 4' and extends to directly contact at least a portion of the cathode contact layer 7. The electrical conducting layer may be formed, for example, of aluminum. The FPC 6 is arranged on a portion of the cathode contact layer 7 which is not covered with the electrical conducting layer 5'.

In this embodiment of the present invention, in order to reduce the contact resistance between the cathode contact layer 7 and the cathode, the electron injecting layer 4' formed not to be in direct contact with the cathode contact layer 7, because it comprises an electrical insulator, such as, for example, lithium fluoride, calcium oxide, or barium oxide. Thus, the electrical conducting layer 5' is formed to directly contact the cathode contact layer 7.

Such a structure of the cathode, which includes the electron injecting layer 4' and the electrical conducting layer 5' can be realized by using different shadow masks for the electron injecting layer 4' which is formed, for example, of lithium fluoride or calcium, and the electrical conducting layer 5' which is formed, for example, of aluminum or silver.

When forming the electron injecting layer 4' on the emissive layer 3 of the OLED by vaporizing a material, such as lithium fluoride or calcium, the areas other than the emissive layer 3 should be covered with a shadow mask, so that the lithium or calcium is deposited on the desired area, such as, the emissive layer 3 to form the electron injecting layer 4'. Next, another shadow mask that exposes the electron injecting layer 4', a portion of the substrate 1, and a portion of the cathode contact layer 7, is applied to the resulting structure, and aluminum or silver is vaporized to form the electrical conducting layer 5' on the electron injecting layer 4' and the exposed portion of the substrate 1 and the cathode contact layer 7. In this way, the structure of the electrical conducting layer 5' which is in direct contact the cathode contact layer 7 may be formed. This reduces the contact resistance between the cathode and the cathode contact layer 7.

Figure 3:
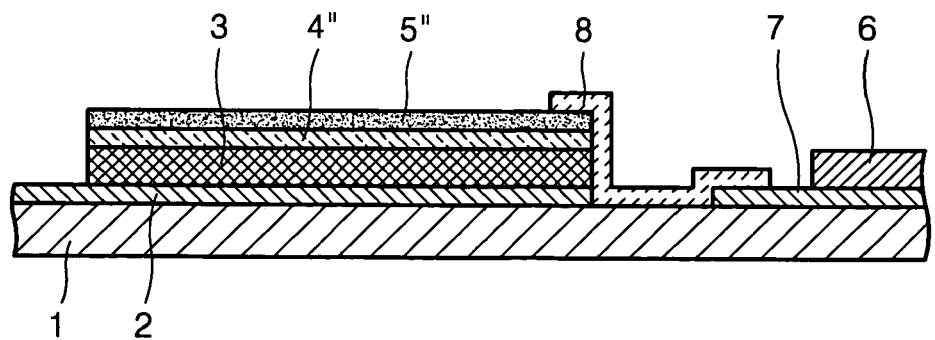
FIG. 3 is a sectional view of an OLED according to anther embodiment of the present invention, which further comprises a connecting layer formed of an electrically conductive material to directly contact both the electrical conducting layer of the cathode and the cathode contact layer.

FIG. 3 is a sectional view of an OLED according to another embodiment of the present invention, which further comprises a connecting layer formed of an electrical conducting material which physically contacts both the electrical conducting layer 5" and the cathode contact layer 7. In FIG. 3, elements having a structure and a function which are common to those of FIG. 1 are denoted by the same reference numerals as those of FIG. 1.

Referring to FIG. 3, an organic OLED according to another embodiment of the present invention includes the anode layer 2 and the cathode contact layer 7 which are arranged on the substrate 1. As shown in FIG. 3, the cathode contact layer 7 and the anode layer 2 are not in contact with one another. The emissive layer 3 is arranged on the anode layer 2, and an electron injecting layer 4" and an electrical conducting layer 5" are formed on the emissive layer 3. Thus, in this embodiment, the electron injecting layer of the cathode and the electrical conducting layer of the cathode may be formed such that they are aligned with the emissive layer.

The electron injecting layer 4" and the electrical conducting layer 5", where neither layer is in direct contact with the cathode contact layer 7 can be implemented with a proper shadow mask.

In this embodiment, a connecting layer 8 is formed of a conductive material, and the connecting layer 8 extends from a portion of the surface of the electrical conducting layer 5" to a portion of the cathode contact layer 7, to electrically connect the electrical conducting layer 5" and the cathode contact layer 7. This connecting layer 8 is formed of a material with great electrical conductivity in order to reduce the contact resistance with respect to the cathode contact layer 7 and the electrical conducting layer 5" of the cathode. For example, the connecting layer 8 may be formed of copper or gold. As a result, the contact resistance between the cathode (including the electron injecting layer 4" and the electrical conducting layer 5") and the cathode contact layer 7 is reduced.

As described above, in an OLED and a method of fabricating the OLED according to the present invention, an electrical conducting layer of a cathode is formed to directly contact at least a portion of a cathode contact layer. Alternatively, a connecting layer formed of an electrically conductive material may be further included to connect an electrical conducting layer and a cathode contact layer, which are separated from one another. As a result, the contact resistance between the cathode and the cathode contact layer is lowered. Therefore, the OLED according to the present invention and a display employing the OLED can be operated with a smaller amount of power.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting diode for a display, comprising:
 a substrate;
 an anode layer having a first end and a second end;
 an emissive layer having a first end and a second end;
 a cathode including an electron injecting layer and an electrical conducting layer; and
 a cathode contact layer which electrically connects the cathode and an electrical driving system of the display,
 wherein the electron injecting layer is formed using a shadow mask such that the electron injecting layer overlaps the emissive layer without extending over the first and the second ends of the anode layer and the emissive layer, and wherein the electrical conducting layer of the cathode is electrically connected with the cathode contact layer and the electron injecting layer is not in direct contact with the cathode contact layer.

2. The organic light-emitting diode of claim 1, wherein the electrical conducting layer of the cathode directly contacts at least a portion of the cathode contact layer.

3. The organic light-emitting diode of claim 1, wherein the electron injecting layer of the cathode is formed of at least one of lithium fluoride, barium, barium oxide, and calcium oxide.

4. The organic light-emitting diode of claim 1, wherein the emissive layer is formed of a light-emitting polymer.

5. The organic light-emitting diode of claim 4, wherein the light-emitting polymer is selected from a group consisting of polyphenylenevinylenes and polyfluorenes.

6. The organic light-emitting diode of claim 1, wherein the emissive layer is formed of polyethylene-dioxythiophene and a light-emitting polymer.

7. The organic light-emitting diode of claim 6, wherein the light emitting polymer is paraphenylene vinylene.

8. The organic light-emitting diode of claim 1, wherein the emissive layer includes a hole injecting layer and a light emitting electron conducting layer.

9. The organic light-emitting diode of claim 8, wherein the hole injecting layer is formed of N,N'-di(naphthalene-1-yl)-N,N'-diphenyl-benzidine, and the light-emitting electron conducting layer is formed of 8-hydroxyquionoline aluminum.

10. The organic light-emitting diode of claim 1, wherein the electrical conducting layer is formed of aluminum or silver.

11. The organic light-emitting diode of claim 1, wherein the anode layer is formed of indium tin oxide.

12. The organic light-emitting diode of claim 1, wherein the cathode contact layer is formed of indium tin oxide.

13. An organic light-emitting diode for a display, comprising:
a substrate;
an anode layer having a first end and a second end;
an emissive layer having a first end and a second end;
a cathode including an electron injecting layer and an electrical conducting layer;
a cathode contact layer which electrically connects the cathode and an electrical driving system of the display; and
a connecting layer formed of an electrically conductive material, the connecting layer directly contacting the cathode contact layer and the electrical conducting layer of the cathode,
wherein the electron injecting layer is formed using a shadow mask such that the electron injecting layer overlaps the emissive layer without extending over the first and the second ends of the anode layer and the emissive layer, and
wherein the electron injecting layer is not in direct contact with the cathode contact layer.

14. The organic light-emitting diode of claim 13, wherein the connecting layer is formed of copper or gold.

15. The organic light-emitting diode of claim 13, wherein the electron injecting layer of the cathode is formed of at least one of lithium fluoride, barium, barium oxide, and calcium oxide.

16. The organic light-emitting diode of claim 13, wherein the emissive layer is formed of a light-emitting polymer.

17. The organic light-emitting diode of claim 16, wherein the light-emitting polymer is selected from a group consisting of polyphenylenevinylenes and polyfluorenes.

18. The organic light-emitting diode of claim 13, wherein the emissive layer is formed of polyethylene-dioxythiophene and a light-emitting polymer.

19. The organic light-emitting diode of claim 18, wherein the light-emitting polymer is paraphenylene vinylene.

20. The organic light-emitting diode of claim 13, wherein the emissive layer includes a hole injecting layer and a light-emitting electron conducting layer.

21. The organic light-emitting diode of claim 20, wherein the hole injecting layer is formed of N,N'-di(naphthalene-1-yl)-N,N'-diphenyl-benzidine, and the light-emitting electron conducting layer is formed of 8-hydroxyquionoline aluminum.

22. The organic light-emitting diode of claim 13, wherein the electrical conducting layer is formed of aluminum or silver.

23. The organic light-emitting diode of claims 13, wherein the anode layer is formed of indium tin oxide.

24. The organic light-emitting diode of claim 13, wherein the cathode contact layer is formed of indium tin oxide.

25. A method of fabricating an organic light-emitting diode for a display, the method comprising:
forming an anode layer having a first end and a second end on a first portion of a substrate;
forming a cathode contact layer on a second portion of the substrate;
forming an emissive layer having a first end and a second end on the anode layer;
forming an electron injecting layer of a cathode on the emissive layer; and forming an electrical conducting layer of the cathode on the electron injecting layer, the electrical conducting layer of the cathode directly contacting at least a portion of the cathode contact layer,
wherein a shadow mask is used to form the electron injecting layer such that the electron injecting layer overlaps the emissive layer without extending over the first and the second ends of the anode layer and the emissive layer, and
wherein the electron injecting layer is not in direct contact with the cathode contact layer.

26. A method of fabricating an organic light-emitting diode for a display, the method comprising:
forming an anode layer having a first end and a second end on a first portion of a substrate;
forming a cathode contact layer on a second portion of the substrate;
forming an emissive layer having a first end and a second end on the anode layer;
sequentially forming an electron injecting layer and an electrical conducting layer of a cathode on the emissive layer; and
forming a connecting layer, the connecting layer directly contacting the cathode contact layer and the electrical conducting layer of the cathode,
wherein a shadow mask is used to form the electron injecting layer such that the electron injecting layer overlaps the emissive layer without extending over the first and the second ends of the anode layer and the emissive layer, and
wherein the electron injecting layer is not in direct contact with the cathode contact layer.

27. The method of claim 26, wherein a shadow mask is used to form the connecting layer.

* * * * *